United States Patent
Ryan et al.

(10) Patent No.: US 9,613,906 B2
(45) Date of Patent: Apr. 4, 2017

(54) INTEGRATED CIRCUITS INCLUDING MODIFIED LINERS AND METHODS FOR FABRICATING THE SAME

(71) Applicant: GLOBALFOUNDRIES, Inc., Grand Cayman (KY)

(72) Inventors: Errol Todd Ryan, Clifton Park, NY (US); Xunyuan Zhang, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 1 day.

(21) Appl. No.: 14/311,457

(22) Filed: Jun. 23, 2014

(65) Prior Publication Data

US 2015/0371898 A1 Dec. 24, 2015

(51) Int. Cl.
*H01L 21/768* (2006.01)
*H01L 23/532* (2006.01)

(52) U.S. Cl.
CPC .. *H01L 23/53238* (2013.01); *H01L 21/76843* (2013.01); *H01L 21/76856* (2013.01); *H01L 21/76868* (2013.01); *H01L 21/7682* (2013.01); *H01L 21/76853* (2013.01); *H01L 21/76855* (2013.01); *H01L 21/76858* (2013.01); *H01L 2924/0002* (2013.01)

(58) Field of Classification Search
CPC ........... H01L 21/76831; H01L 21/7682; H01L 21/76826; H01L 21/76838; H01L 21/76843; H01L 21/76853; H01L 21/76855; H01L 21/76856; H01L 21/76858

USPC ......................................................... 438/622
See application file for complete search history.

(56) References Cited

U.S. PATENT DOCUMENTS

| | | | | |
|---|---|---|---|---|
| 5,488,015 A | * | 1/1996 | Havemann | H01L 21/02123 148/DIG. 118 |
| 6,114,259 A | * | 9/2000 | Sukharev | H01L 21/02126 257/E21.256 |
| 6,180,518 B1 | * | 1/2001 | Layadi | H01L 21/02063 257/E21.256 |
| 6,417,118 B1 | * | 7/2002 | Hu | H01L 21/02134 257/E21.242 |
| 6,514,881 B1 | * | 2/2003 | Coffman | H01L 21/02126 257/E21.269 |
| 6,528,409 B1 | * | 3/2003 | Lopatin | H01L 21/288 257/E21.174 |
| 6,537,896 B1 | * | 3/2003 | Catabay | H01L 21/02107 257/E21.273 |

(Continued)

FOREIGN PATENT DOCUMENTS

| WO | 2007/142329 | * | 12/2007 | ........... H01L 21/285 |
|---|---|---|---|---|
| WO | WO 2008/146879 | * | 12/2008 | ........... H01L 21/768 |

(Continued)

*Primary Examiner* — Mary Wilczewski
(74) *Attorney, Agent, or Firm* — Lorenz & Kopf, LLP

(57) ABSTRACT

Integrated circuits and methods for fabricating integrated circuits are provided. In one example, a method for fabricating an integrated circuit includes contacting a liner that is disposed adjacent to a porous interlayer dielectric (ILD) layer of dielectric material with a selectively reactive gas at reaction conditions. A portion of the liner is reacted with the selectively reactive gas to form a converted expanded portion that is disposed between a remaining portion of the liner and the porous ILD layer.

20 Claims, 3 Drawing Sheets

(56) References Cited

U.S. PATENT DOCUMENTS

| | | | |
|---|---|---|---|
| 6,596,467 B2 * | 7/2003 | Gallagher | B29C 67/202 257/E21.261 |
| 6,734,090 B2 * | 5/2004 | Agarwala | H01L 21/76801 257/E21.576 |
| 6,737,365 B1 * | 5/2004 | Kloster | H01L 21/02126 257/E21.273 |
| 6,921,978 B2 * | 7/2005 | Clevenger | H01L 21/76807 257/751 |
| 6,962,869 B1 * | 11/2005 | Bao | H01L 21/3105 257/E21.576 |
| 7,015,150 B2 * | 3/2006 | Cooney, III | H01L 21/02107 257/E21.241 |
| 7,052,990 B2 * | 5/2006 | Kim | H01L 21/76831 257/E21.577 |
| 7,064,060 B2 * | 6/2006 | Misawa | H01L 21/02063 257/E21.252 |
| 7,122,481 B2 * | 10/2006 | Kloster | H01L 21/3105 216/46 |
| 7,157,387 B2 * | 1/2007 | Bhattacharyya | H01L 21/02337 257/E21.273 |
| 7,163,780 B2 * | 1/2007 | Gallagher | B29C 67/202 257/E21.261 |
| 7,166,531 B1 * | 1/2007 | van den Hoek | H01L 21/02126 257/E21.273 |
| 7,199,048 B2 * | 4/2007 | Chu | H01L 21/28556 257/E21.17 |
| 7,208,418 B1 * | 4/2007 | Okada | H01L 21/76831 257/E21.579 |
| 7,223,705 B2 * | 5/2007 | Sriram | H01L 21/02126 257/E21.241 |
| 7,233,071 B2 * | 6/2007 | Furukawa | B82Y 10/00 257/759 |
| 7,271,089 B2 * | 9/2007 | Sandu | H01L 21/76802 257/E21.577 |
| 7,294,453 B2 * | 11/2007 | Gallagher | B29C 67/202 257/E21.261 |
| 7,304,384 B2 * | 12/2007 | Koike | H01L 21/76831 257/751 |
| 7,507,569 B2 * | 3/2009 | Minning | C11D 3/38636 435/221 |
| 7,510,982 B1 * | 3/2009 | Draeger | H01L 21/02126 257/E21.273 |
| 7,670,944 B2 * | 3/2010 | Raaijmakers | C23C 16/0272 257/761 |
| 7,759,251 B2 * | 7/2010 | Geffken | H01L 21/3105 438/700 |
| 7,858,510 B1 * | 12/2010 | Banerji | C23C 16/0227 257/E21.269 |
| 8,022,497 B2 * | 9/2011 | Shishida | H01L 21/02126 257/499 |
| 8,384,208 B2 * | 2/2013 | Shishida | H01L 21/02126 257/700 |
| 8,828,489 B2 * | 9/2014 | Dubois | H01L 21/02203 427/245 |
| 8,932,934 B2 * | 1/2015 | Chae | H01L 21/76843 438/407 |
| 9,214,335 B2 * | 12/2015 | Bruce | H01L 21/02315 |
| 2001/0051420 A1 * | 12/2001 | Besser | H01L 21/76802 438/597 |
| 2004/0224494 A1 * | 11/2004 | Clevenger | H01L 21/76807 438/622 |
| 2004/0224536 A1 * | 11/2004 | Sriram | H01L 21/02126 438/781 |
| 2005/0020074 A1 * | 1/2005 | Kloster | H01L 21/3105 438/689 |
| 2005/0191847 A1 * | 9/2005 | Misawa | H01L 21/02063 438/624 |
| 2005/0218519 A1 * | 10/2005 | Koike | H01L 21/76831 257/756 |
| 2005/0282404 A1 * | 12/2005 | Nguyen | H01L 21/02164 438/788 |
| 2007/0032068 A1 * | 2/2007 | Ogawa | H01L 21/76831 438/622 |
| 2007/0066079 A1 * | 3/2007 | Kloster | H01L 21/3105 438/725 |
| 2007/0190804 A1 * | 8/2007 | Beck | H01L 21/02074 438/775 |
| 2007/0205484 A1 * | 9/2007 | Shishida | H01L 21/02126 257/499 |
| 2010/0117232 A1 * | 5/2010 | Nakao | C23C 16/402 257/751 |
| 2015/0371898 A1 * | 12/2015 | Ryan | H01L 21/76843 257/734 |

FOREIGN PATENT DOCUMENTS

| | | | | |
|---|---|---|---|---|
| WO | WO 2009/096264 | * | 8/2009 | H01L 21/768 |
| WO | WO 2013/125449 | * | 8/2013 | H01L 21/3205 |

* cited by examiner

INTEGRATED CIRCUITS INCLUDING MODIFIED LINERS AND METHODS FOR FABRICATING THE SAME

TECHNICAL FIELD

The technical field relates generally to integrated circuits and methods for fabricating integrated circuits, and more particularly relates to integrated circuits including a modified liner such as for a back-end-of-the-line interconnect structure and methods for fabricating such integrated circuits.

BACKGROUND

Integrated circuits (ICs) typically include a plurality of semiconductor devices over a semiconductor substrate and interconnect wiring. Networks of metal interconnect wiring are often used to connect the semiconductor devices from the semiconductor portion of the substrate. Multiple levels of metal interconnect wiring form a plurality of metallization layers above the semiconductor portion of the substrate and are connected together to form a back-end-of-the-line ("BEOL") interconnect structure. Within such a structure, metal lines run parallel to the substrate in the metallization layers and conductive vias run perpendicular to the substrate between the metallization layers to selectively interconnect the metal lines.

High performance of contemporary ICs may be achieved using a highly conductive metal, such as copper (Cu), as the interconnect metal of the BEOL interconnect structure. Contemporary ICs may also employ a low dielectric constant material or dielectric material as an interlevel dielectric (ILD) layer or layers to insulate the interconnect wires from each other. To help prevent migration of the interconnect metal into the ILD layer and further, to help hold the highly conductive interconnect metal to the underlying dielectric material, one or more layers of a liner-forming material(s), such as tantalum (Ta) and/or tantalum nitride (TaN), is deposited onto the dielectric material to form a liner. Then, a conductive metal seed layer, such as a layer of copper (Cu) or copper alloy, is formed on the metal liner, and the highly conductive metal (e.g., Cu) is deposited over the conductive metal seed layer to form a metal interconnect wire. Unfortunately, many conventional approaches for forming the liners for such interconnect structures can produce non-conformal liners that may be locally too thin along various surfaces (e.g., along vertical walls) of the ILD layer. Such non-conformal liners cause discontinuity issues and the like. Moreover, depositing additional liner-forming material(s) to increase the thickness of locally thinned out areas may undesirably cause other portions of the liner to become too thick (e.g., around corners of the ILD layer), which can undesirably increase the resistance of the interconnect structure.

Accordingly, it is desirable to provide methods for fabricating integrated circuits including forming liners that are more conformal and not locally too thin such as for back-end-of-the-line interconnect structures, and integrated circuits formed by such methods. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes contacting a liner that is disposed adjacent to a porous interlayer dielectric (ILD) layer of dielectric material with a selectively reactive gas at reaction conditions. A portion of the liner is reacted with the selectively reactive gas to form a converted expanded portion that is disposed between a remaining portion of the liner and the porous ILD layer.

In accordance with another exemplary embodiment, a method for fabricating an integrated circuit is provided. The method includes forming a liner on a porous interlayer dielectric (ILD) layer of dielectric material. The liner has an ILD facing surface that faces the porous ILD layer and an inner liner surface that is on a side opposite the ILD facing surface. A conductive metal fill is deposited overlying the liner adjacent to the inner liner surface. A selectively reactive gas is advanced through the porous ILD layer for contact with the ILD facing surface at reaction conditions effective to react a portion of the liner with the selectively reactive gas to form a converted expanded portion.

In accordance with another exemplary embodiment, an integrated circuit is provided. The integrated circuit includes a semiconductor substrate. A porous interlayer dielectric (ILD) layer of dielectric material overlies the semiconductor substrate. A modified liner is disposed adjacent to the porous ILD layer. The modified liner includes a remaining portion including a liner-forming material and a converted expanded portion. The converted expanded portion is disposed between the remaining portion and the porous ILD layer and includes a reaction product of the liner-forming material and a selectively reactive gas.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits and methods for fabricating integrated circuits. The exemplary embodiments taught herein include depositing a liner-forming material(s) on a porous interlayer dielectric (ILD) layer of dielectric material (e.g., a relatively porous dielectric material) to form a liner. The liner has an ILD facing surface that faces the porous ILD layer and an inner liner surface that is on a side opposite the ILD facing surface. A conductive metal fill is deposited overlying the liner adjacent to the inner liner surface to form a metal interconnect such as for a back-end-of-the-line (BEOL) interconnect structure.

In an exemplary embodiment, exposed surfaces of the porous ILD layer that are laterally adjacent to the metal interconnect are exposed to a selectively reactive gas that does not substantially react with the porous ILD layer. The selectively reactive gas is advanced through a porous network of the porous ILD layer and contacts the ILD facing surface of the liner at reaction conditions. A portion of the liner reacts with the selectively reactive gas to produce a reaction product that remains intact with a remaining portion of the liner to form a modified liner with a converted expanded portion. In an exemplary embodiment, during the reaction, the selectively reactive gas adds material (e.g., atoms, groups of atoms, or moieties) relatively evenly to the portion of the liner such that the reaction product has a greater volume than the original liner-forming material(s) so that the converted expanded portion effectively increases the overall thickness of the liner more uniformly even in areas of the liner that may be relatively thin.

FIGS. 1-6 illustrate, in cross-sectional view, an integrated circuit (IC) 10 during various fabrication stages. The described process steps, procedures, and materials are to be considered only as exemplary embodiments designed to illustrate to one of ordinary skill in the art methods for practicing the invention; the invention is not limited to these exemplary embodiments. Various steps in the manufacture of ICs are well known and so, in the interest of brevity, many conventional steps will only be mentioned briefly herein or will be omitted entirely without providing the well-known process details.

Figure 1:
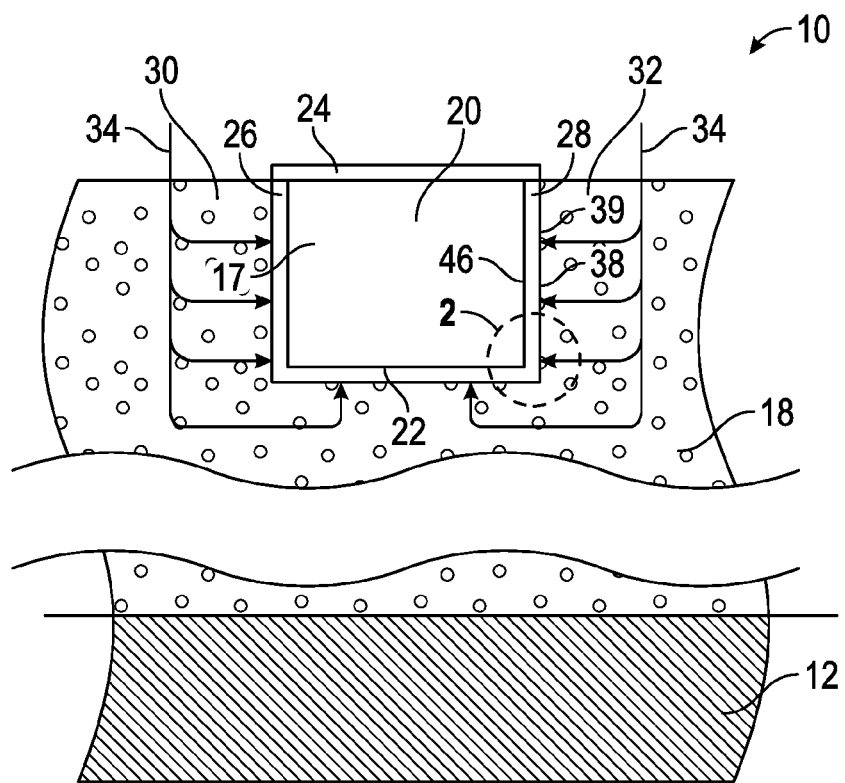
FIGS. 1-6 illustrate, in cross-sectional views, an integrated circuit and a method for fabricating an integrated circuit during various intermediate fabrication stages in accordance with exemplary embodiments.

FIG. 1 illustrates a portion of the IC 10 during an intermediate fabrication stage in accordance with an exemplary embodiment. The IC 10 includes a semiconductor substrate 12. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

Additionally, the semiconductor substrate 12 may include active areas (not shown) in which a plurality of active and/or passive circuit elements (not shown), such as transistors, capacitors, resistors, and the like may be formed therein and/or thereon. It should be appreciated that the semiconductor substrate 12, even if including a substantially silicon-based material layer, may include other semiconducting materials in addition to appropriate dopant species for establishing the requisite active area conductivity type for the circuit elements.

As illustrated in FIG. 1, above the semiconductor substrate 12, the IC 10 includes a conductive interconnect structure 17 (e.g., metal line or conductive via) that is disposed in a porous interlayer dielectric (ILD) layer 18 of dielectric material (e.g., porous dielectric material). The porous ILD layer 18 may be made up of a suitable dielectric material, such as silicon dioxide ($SiO_2$), carbon-doped oxide, organosilicate glass, or the like. In an exemplary embodiment, the porous ILD layer 18 is a dielectric material that includes silicon and oxygen, such as $SiO_2$ or SiCOH, for example SiCOH. In an exemplary embodiment, the porous ILD layer 18 has a porosity content of from about 10 to about 25 volume percent (vol. %) of the porous ILD layer 18 and has porosity with an average pore diameter of from about 1 to about 2 nm. The porous ILD layer 18 may be relatively thick with a thickness, for example, of from about 200 to about 1500 nm.

Electrical connection(s) between the conductive interconnect structure 17 and the electrical devices (not shown) that may be disposed on and/or in the semiconductor substrate 12 can be established with one or more conductive vias (not shown) in the porous ILD layer 18. It is to be appreciated that, depending on the overall device requirements, the IC 10 may include many conductive interconnect structures 17 that may be disposed, for example, in one or more layers in which each layer defines a metallization layer as is well known in the art. The metallization layers may be connected together to form a back-end-of-the-line ("BEOL") interconnect structure.

The conductive interconnect structure 17 is formed of a conductive metal fill 20 that may also include a conductive seed layer as is well known in the art and a liner 22. An exemplary conductive metal fill 20 is a highly conductive material such as copper. An exemplary liner 22 is one or more layers of a liner-forming material(s) such as tantalum (Ta), tantalum nitride (TaN), and/or manganese (Mn) to help inhibit or prevent diffusion of the conductive metal fill 20 into the porous ILD layer 18 and/or to help hold the conductive metal fill 20 to the porous ILD layer 18. In an exemplary embodiment, the liner 22 is formed of multiple layers including a barrier layer of Ta with one or more overlying liner layers of TaN. In an exemplary embodiment, the liner 22 has a thickness of from about 0.5 to about 10 nm.

As illustrated, a protective cap 24 is disposed overlying the conductive metal fill 20 and edge portions 26 and 28 of the liner 22 while the surface portions 30 and 32 of the porous ILD layer 18 that are laterally adjacent to the protective cap 24 are exposed. In an exemplary embodiment, the protective cap 24 is formed of a protective cap-forming material that includes cobalt (Co), ruthenium (Ru), and/or aluminum nitride (AlN), for example MN.

The illustrated portion of the IC 10 may be formed on the basis of well-known techniques. In an exemplary embodiment, the porous ILD layer 18 is formed by depositing a dielectric material such as $SiO_2$ or SiCOH that includes organic porogen overlying the semiconductor substrate 12. The dielectric material may be deposited using a chemical vapor deposition (CVD) process and the dielectric material may be treated, for example with UV radiation, to out gas the porogen and form porosity in the porous ILD layer 18 to further lower the dielectric constant of the dielectric material. Next, the exemplary porous ILD layer 18 is patterned and etched using, for example, a dry etching process to form a metal line trench or via-hole. The metal line trench or via-hole is then filled by depositing a liner-forming material(s) and the conductive metal fill 20 into the trench or hole, such as by using a physical vapor deposition (PVD) process (or an atomic layer deposition (ALD) process) and an electrochemical plating (ECP) process, respectively, to form the conductive interconnect structure 17. Any overburden of the conductive metal fill 20 and/or the liner-forming material(s) is removed by CMP. Next, a protective-cap forming material is deposited overlying the conductive interconnect structure 17 and the porous ILD layer 18 using a selective CVD process. As illustrated, the conductive metal fill 20 is completely encapsulated within the liner 22 and the protective cap 24 so that the conductive metal fill 20 is not exposed to subsequent processing with a selectively reactive gas 34 as described in further detail below.

As illustrated, the surface portions 30 and 32 of the porous ILD layer 18 are exposed to the selectively reactive gas 34.

In an exemplary embodiment, the selectively reactive gas 34 selectively reacts with certain metals such as the various liner-forming material(s) described herein while substantially not reacting with various dielectric materials such as the dielectric material(s) described herein that form the porous ILD layer 18. In an exemplary embodiment, the protective cap 24 is formed of a dielectric material such as MN and the selectively reactive gas 34 also does not substantially react with the protective cap 24. In an exemplary embodiment, the selectively reactive gas 34 is a silane-containing gas such as a silane-rich gas, an oxygen-containing gas such as an oxygen-rich gas, or the like.

Figure 2:
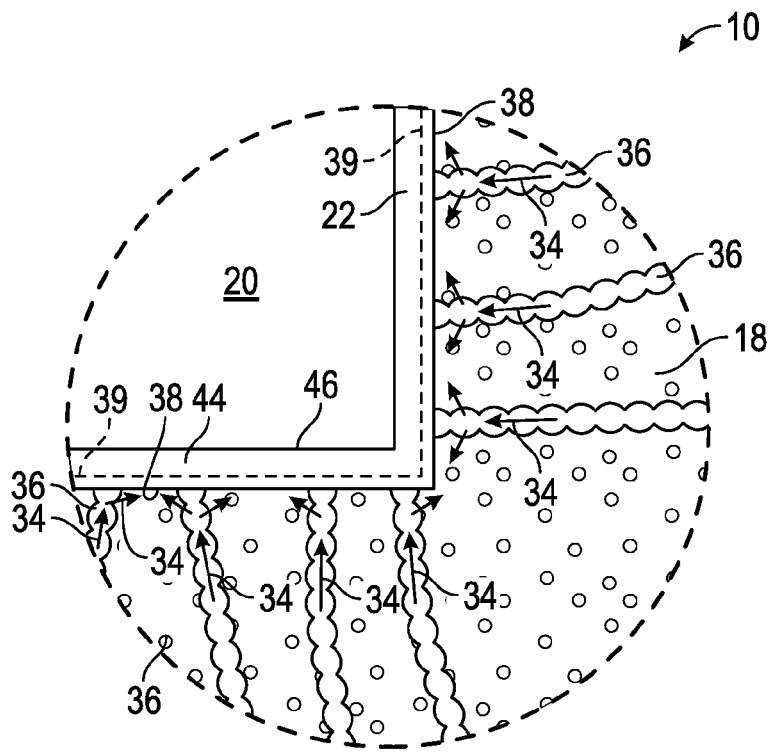
Figure 3:
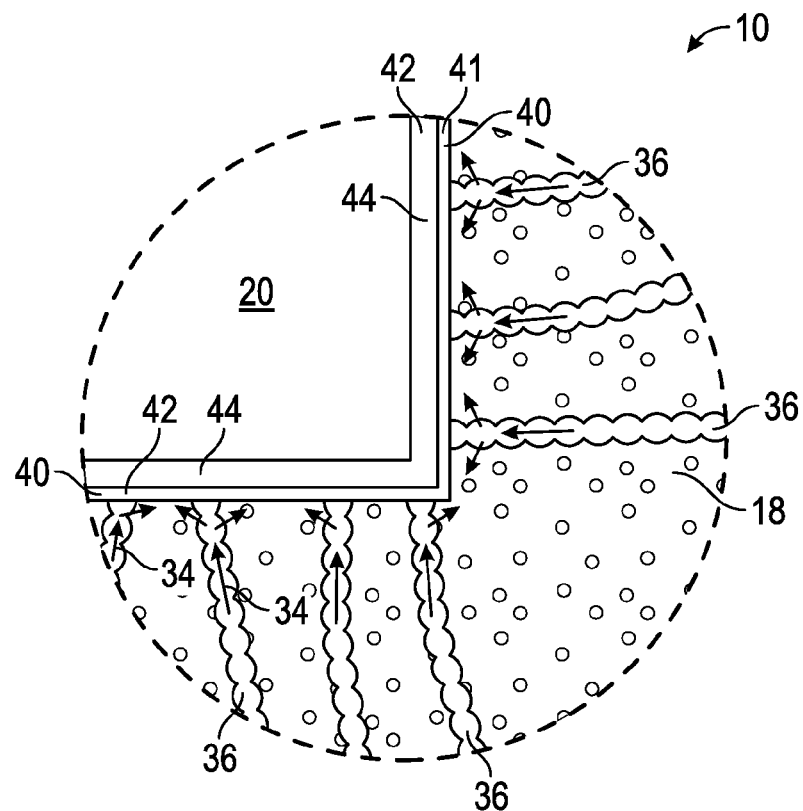

Referring to FIGS. 1-3, in an exemplary embodiment, the selectively reactive gas 34 advances from the surface portions 30 and 32 through a porous network 36 of the porous ILD layer 18 and contacts an ILD facing surface 38 of the liner 22 at reaction conditions. The selectively reactive gas 34 reacts with an outer portion 39 (shown in FIG. 2 with dashed lines) of the liner 22 to form a reaction product 41 (shown in FIG. 3) that remains intact to (e.g., affixed or coupled to) an inner remaining portion 44 from the liner 22 to define a modified liner 42. In particular, the reaction product 41 forms a converted expanded portion 40 that is disposed between the porous ILD layer 18 and the inner remaining portion 44 from the liner 22. As shown in FIG. 2, the inner remaining portion 44 is on a side opposite the outer portion 39 of the liner 22 and includes an inner liner surface 46 that is adjacent to the conductive metal fill 20. In an exemplary embodiment, the selectively reactive gas 34 does not substantially react with the inner remaining portion 44 so that the inner remaining portion 44 can effectively functions as a diffusion barrier to prevent mass transfer of the selectively reactive gas 34 to the conductive metal fill 20 and prevent conversion of the conductive metal fill 20, for example, to a relatively more resistive (or less conductive) material.

In an exemplary embodiment, the reaction conditions include a temperature of from about 20 to about 400° C. and a vapor pressure of the selectively reactive gas 34 of from about 0.13 Pa to about 13.34 KPa. In an exemplary embodiment, the porous ILD layer 18 is exposed to the selectively reactive gas 34 for an exposure time of from about 1 second to about 1 hour.

In an exemplary embodiment, during the reaction, the selectively reactive gas 34 adds material (e.g., atoms, groups of atoms, or moieties) relatively evenly to the outer portion 39 of the liner 22 such that the reaction product 41 has a greater volume than the original liner-forming material(s) so that the converted expanded portion 40 effectively increases the overall thickness of the liner 22 more uniformly even in areas that the liner 22 may be relatively thin. In an exemplary embodiment and as shown in FIG. 2, the outer portion 39 of the liner 22 has a thickness of from about 1 Å to about 2 nm. In an exemplary embodiment and as shown in FIG. 3, the converted expanded portion 40 of the modified liner 42 has a thickness of from about 2 Å to about 3 nm and the modified liner 42 has a thickness of from about 0.5 to about 13 nm.

In an exemplary embodiment, the selectively reactive gas 34 is a silane-containing gas and the reaction product 41 is a metal silicide. In one example, the liner-forming material(s) that forms the liner 22 includes tantalum and/or tantalum nitride that reacts with the selectively reactive gas 34 to form the reaction product 41 that includes tantalum silicide and/or tantalum nitride silicide.

Figure 4:
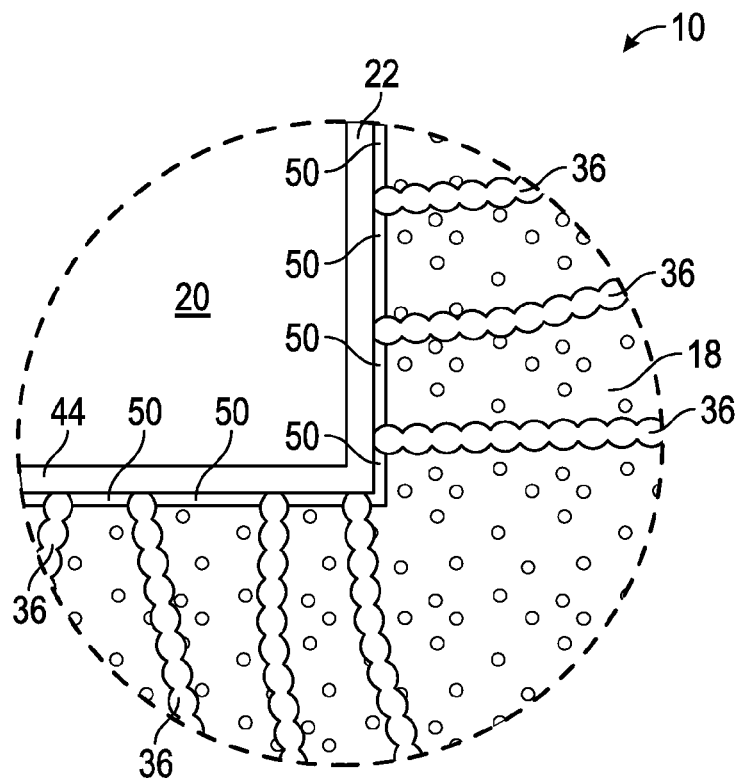

Referring to FIGS. 1 and 4, in another exemplary embodiment, the liner 22 is formed of a liner-forming material that includes manganese (Mn), such as, for example, substantially pure Mn metal and the porous ILD layer 18 includes silicon and oxygen, such as $SiO_2$ or SiCOH, for example SiCOH. As such, after forming the liner 22 but prior to introducing the selectively reactive gas 34 to the porous ILD layer 18, sections of the outer portion 39 of the liner 22 that are in direct contact with locally denser, less porous portions of the porous ILD layer 18 will react with the porous ILD layer 18 to form a reaction product that defines converted expanded portions 50 that are disposed between sections of the inner remaining portion 44 of the liner 22 and the porous ILD layer 18. In an exemplary embodiment, the reaction conditions for forming the converted expanded portion 50 include a temperature of from about 20 to about 400° C., a pressure of from about 0.13 Pa to about 13.34 KPa, and a time of from about 1 second to about 1 hour. In an exemplary embodiment, the converted expanded portion 50 includes magnesium oxide and/or magnesium silicate.

Figure 5:
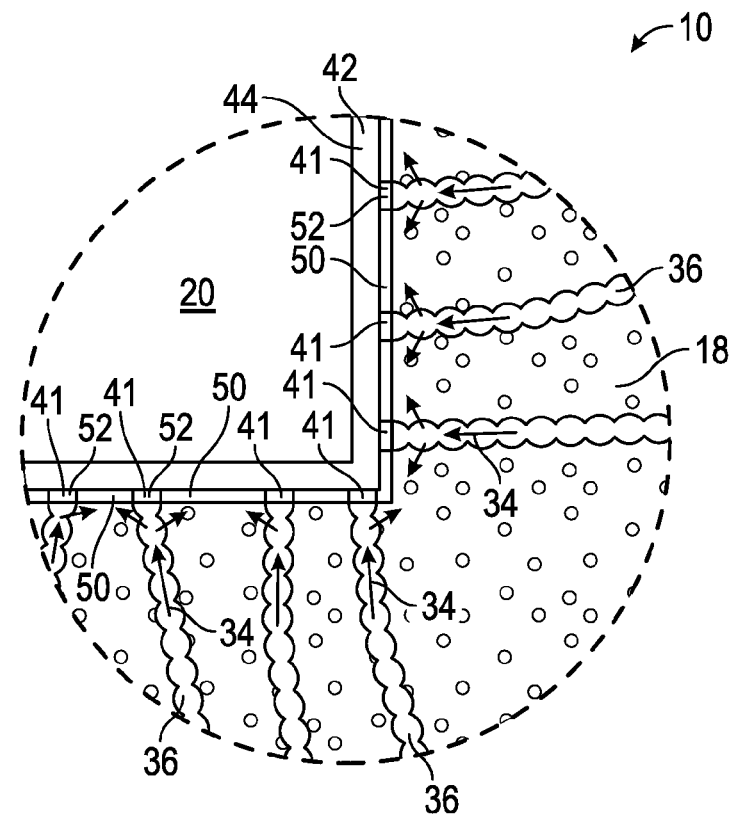

Referring to FIGS. 1 and 4-5, the process continues by exposing the surface portions 30 and 32 of the porous ILD layer 18 to the selectively reactive gas 34 as discussed above. The selectively reactive gas 34 advances from the surface portions 30 and 32 through the porous network 36 of the porous ILD layer 18 and contacts sections of the ILD facing surface 38 of the liner 22 that are adjacent to the converted expanded portions 50 and the open pore spaces or the porous network 36 of the porous ILD layer 18. At the reaction conditions as discussed above, the selectively reactive gas 34 reacts with sections of the outer portion 39 immediately adjacent to the open pore spaces of the porous ILD layer 18 to form the reaction product 41 (shown in FIG. 5) that remains intact to the corresponding sections of the inner remaining portion 44 from the liner 22. The reaction product 41 forms converted expanded portions 52 that are disposed between the corresponding sections of the inner remaining portion 44, the porous ILD layer 18, and the converted expanded portions 50. In an exemplary embodiment, together the inner remaining portion 44 of the liner 22 and the converted expanded portions 50 and 52 define the modified liner 42 (shown in FIG. 5). In an exemplary embodiment, material (e.g., atoms, groups of atoms, or moieties) is added from portions of the porous ILD layer 18 and the selectively reactive gas 34 relatively evenly to the outer portion 39 of the liner 22 such that the converted expanded portions 50 and 52, respectively, are thicker than the outer portion 39 to effectively increase the overall thickness of the liner 22 more uniformly even in areas of the liner 22 that may be relatively thin.

In an exemplary embodiment, the selectively reactive gas 34 is an oxygen-containing gas and the reaction product 41 is a metal oxide. In one example, the liner-forming material that forms the liner 22 includes manganese that reacts with the oxygen-containing gas to form the reaction product 41 that includes manganese oxide.

Figure 6:
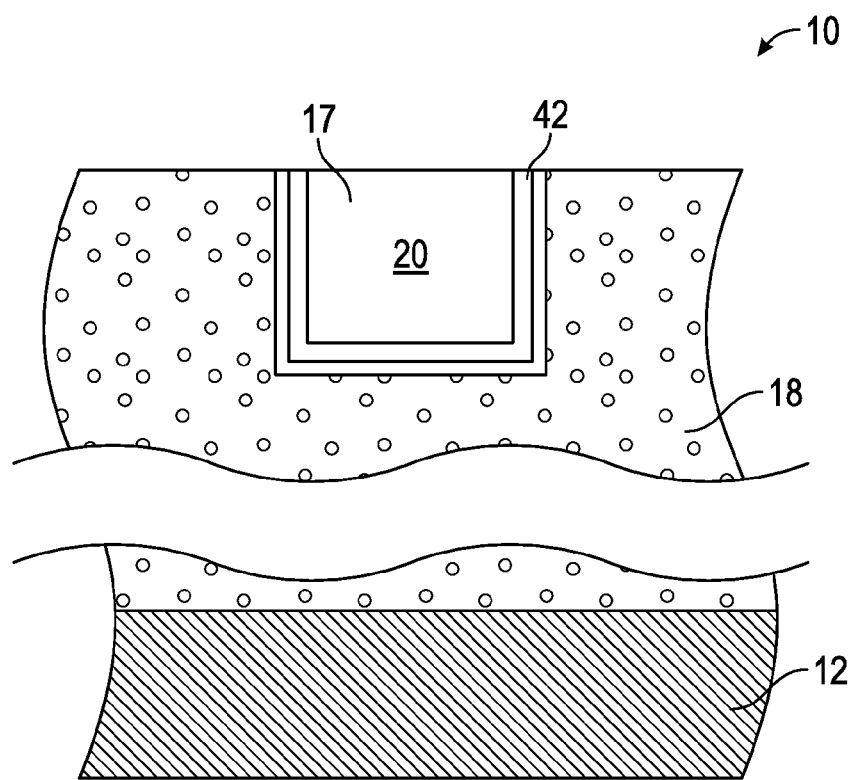

The process continues as illustrated in FIG. 6 by removing the protective cap 24 (shown in FIG. 1) using a CMP process to expose the conductive metal fill 20 for subsequent processing of the IC 10. Accordingly, integrated circuits including a modified liner such as for a back-end-of-the-line interconnect structure and methods for fabricating such integrated circuits have been described.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
   providing a liner on a porous interlayer dielectric (ILD) layer of dielectric material with a conductive metal fill overlying the liner and a protective cap overlying the conductive metal fill while leaving adjacent portions of the porous ILD layer that are adjacent to the protective cap exposed and having exposed surfaces;
   thereafter, contacting the liner that is disposed adjacent to the porous interlayer dielectric (ILD) layer of dielectric material with a selectively reactive gas at reaction conditions effective to react a portion of the liner with the selectively reactive gas to form a converted expanded portion that is disposed between a remaining portion of the liner and the porous ILD layer, wherein the exposed surfaces of the adjacent portions are exposed to the selectively reactive gas to contact the liner with the selectively reactive gas.

2. The method of claim 1, wherein contacting comprises contacting the liner that comprises tantalum, tantalum nitride, manganese, or a combination thereof.

3. The method of claim 1, wherein contacting comprises contacting the liner with the selectively reactive gas that comprises silane, oxygen, or a combination thereof.

4. The method of claim 1, wherein contacting comprises contacting the liner that is disposed adjacent to the porous ILD layer that has a porosity content of from about 10 to about 25 vol. % of the porous ILD layer.

5. The method of claim 1, wherein contacting comprises contacting the liner that is disposed adjacent to the porous ILD layer that has porosity with an average pore diameter of from about 1 to about 2 nm.

6. The method of claim 1, wherein contacting comprises reacting the portion of the liner with the selectively reactive gas at the reaction conditions that include a temperature of from about 20 to about 400° C.

7. The method of claim 1, wherein contacting comprises reacting the portion of the liner with the selectively reactive gas at the reaction conditions that include a vapor pressure of the selectively reactive gas of from about 0.13 Pa to about 13.34 KPa.

8. The method of claim 1, wherein contacting comprises exposing the porous ILD layer to the selectively reactive gas at the reaction conditions that include an exposure time of from about 1 second to about 1 hour.

9. The method of claim 1, wherein contacting comprises forming the converted expanded portion having a thickness of from about 2 Å to about 3 nm.

10. The method of claim 1, wherein the protective cap is provided disposed over edge portions of the liner while the exposed surfaces of the porous ILD layer that are laterally adjacent to the protective cap are exposed.

11. The method of claim 1, wherein providing the conductive metal fill comprises providing the conductive metal fill completely encapsulated within the liner and the protective cap so that the conductive metal fill is not exposed to subsequent processing with the selectively reactive gas.

12. A method for fabricating an integrated circuit, the method comprising:
    forming a liner on a porous interlayer dielectric (ILD) layer of dielectric material, wherein the liner has an ILD facing surface that faces the porous ILD layer and an inner liner surface that is on a side opposite the ILD facing surface;
    depositing a conductive metal fill overlying the liner adjacent to the inner liner surface;
    selectively forming a protective cap overlying the conductive metal fill while leaving adjacent portions of the porous ILD layer that are adjacent to the protective cap exposed and having exposed surfaces; and
    thereafter, advancing a selectively reactive gas through the porous ILD layer by exposing the exposed surfaces of the adjacent portions of the porous ILD layer to the selectively reactive gas for contact with the ILD facing surface at reaction conditions effective to react a portion of the liner with the selectively reactive gas to form a converted expanded portion.

13. The method of claim 12, wherein selectively forming the protective cap comprises depositing a protective cap-forming material overlying the conductive metal fill, and wherein the protective cap-forming material comprises cobalt, ruthenium, aluminum nitride, or combinations thereof.

14. The method of claim 12, further comprising:
    planarizing the conductive metal fill and the porous ILD layer using a chemical mechanical planarization (CMP) process prior to selectively forming the protective cap.

15. The method of claim 12, wherein forming the liner comprises forming the liner on the porous ILD layer that comprises silicon and oxygen.

16. The method of claim 15, wherein forming the liner comprises depositing a liner-forming material that comprises manganese, and wherein a first portion of the liner reacts with the porous ILD layer to form a first converted expanded portion that is disposed between a first remaining portion of the liner and the porous ILD layer and that comprises manganese oxide, manganese silicate, or combinations thereof.

17. The method of claim 16, wherein advancing the selectively reactive gas comprises contacting the ILD facing surface that is disposed adjacent to the first converted expanded portion with the selectively reactive gas to form a second converted expanded portion that is disposed between a second remaining portion of the liner and the porous ILD layer.

18. The method of claim 17, wherein advancing the selectively reactive gas comprises contacting the ILD facing surface with the selectively reactive gas that comprises oxygen to form the second converted expanded portion that comprises manganese oxide.

19. The method of claim 12, wherein forming the liner comprises depositing a liner-forming material that comprises tantalum, tantalum nitride, or a combination thereof.

20. The method of claim 19, wherein advancing the selectively reactive gas comprises contacting the ILD facing surface with the selectively reactive gas that comprises silane to form the converted expanded portion that comprises tantalum silicide, tantalum nitride silicide, or a combination thereof.

* * * * *